(12) United States Patent
Teo et al.

(10) Patent No.: US 6,204,137 B1
(45) Date of Patent: Mar. 20, 2001

(54) METHOD TO FORM TRANSISTORS AND LOCAL INTERCONNECTS USING A SILICON NITRIDE DUMMY GATE TECHNIQUE

(75) Inventors: Kok Hin Teo; Feng Chen; Alex See, all of Singapore (SG); Lap Chan, San Francisco, CA (US)

(73) Assignee: Chartered Semiconductor Manufacturing, Ltd., Singapore (SG)

( * ) Notice: Subject to any disclaimer, the term of this patent is extended or adjusted under 35 U.S.C. 154(b) by 0 days.

(21) Appl. No.: 09/556,386

(22) Filed: Apr. 24, 2000

(51) Int. Cl.[7] .................................................. H01L 21/336
(52) U.S. Cl. ............................ 438/305; 438/296; 438/655
(58) Field of Search .................................. 438/296, 303, 438/305, 306, 307, 655, 656

(56) References Cited

U.S. PATENT DOCUMENTS

| | | | |
|---|---|---|---|
| 5,686,321 | 11/1997 | Ko et al. | 437/29 |
| 5,786,255 | 7/1998 | Yeh et al. | 438/299 |
| 5,856,225 | 1/1999 | Lee et al. | 438/291 |
| 5,915,181 | 6/1999 | Tseng | 438/289 |
| 5,915,183 | 6/1999 | Gambino et al. | 438/300 |
| 6,022,781 | * 2/2000 | Noble et al. | 438/305 |
| 6,077,748 | * 6/2000 | Gardner et al. | 438/296 |

* cited by examiner

*Primary Examiner*—Chandra Chaudhari
(74) *Attorney, Agent, or Firm*—George O. Saile; Rosemary L S. Pike (57) ABSTRACT

A new method of forming MOS transistors has been achieved. A pad oxide layer is grown. A silicon nitride layer is deposited. Trenches are etched for planned STI. A trench liner is grown inside of the trenches. A trench oxide layer is deposited filling the trenches. The trench oxide layer is polished down to complete the STI. The same silicon nitride layer is patterned to form dummy gates. A gate liner layer is deposited. Ions are implanted to form lightly doped drain junctions. Sidewall spacers are formed adjacent to the dummy gate electrodes and the shallow trench isolations. Ions are implanted to form the drain and source junctions. An epitaxial silicon layer is grown overlying the source and drain junctions. A metal layer is deposited. The epitaxial silicon layer is converted into sulicide to form silicided source and drain contacts. An interlevel dielectric layer is deposited and polished down to the dummy gates. The dummy gates are etched away to form openings for the planned transistor gates. A gate oxide layer is deposited lining the transistor gate openings. A gate electrode layer is deposited to fill the transistor gate openings. The gate electrode layer is patterned to complete the transistor gates.

20 Claims, 6 Drawing Sheets

METHOD TO FORM TRANSISTORS AND LOCAL INTERCONNECTS USING A SILICON NITRIDE DUMMY GATE TECHNIQUE

BACKGROUND OF THE INVENTION (1) Field of the Invention

The invention relates to a method of fabricating semiconductor structures, and more particularly, to a method of forming MOS transistors and local interconnects in the manufacture of integrated circuit devices.

(2) Description of the Prior Art

In the prior art, the method used to form MOS transistors is sequentially separate from that used to form the isolation structures that surround the transistors. The shallow trench isolation (STI) method is independent and preceeds the transistor method.

Figure 1:
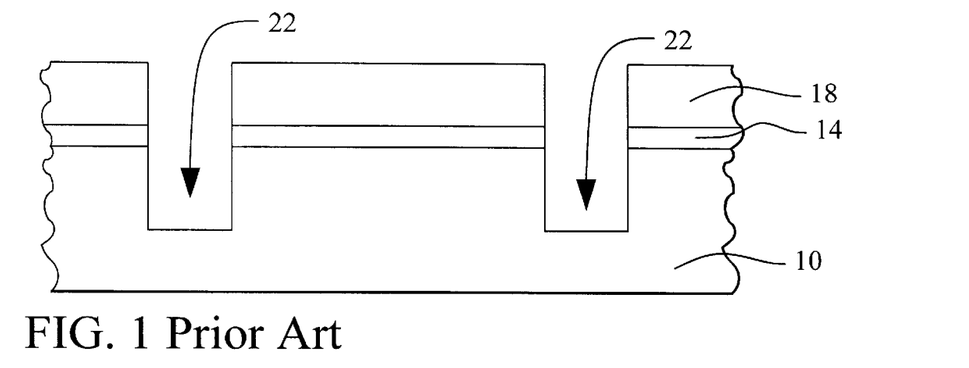
FIGS. 1 through 3 schematically illustrate in cross-section partially completed prior art integrated circuit devices.

Referring now to FIG. 1, a cross section of prior art integrated circuit device is shown. This cross section illustrates the typical sequence in the prior art. A semiconductor substrate 10 is provided. A pad oxide layer 14 is formed overlying the semiconductor substrate 10. A silicon nitride layer 18 is deposited overlying the pad oxide layer 14. A masking operation is used to define a pattern of active areas. Trenches 22 are etched through the silicon nitride layer 18, and the pad oxide layer 14, and into the semiconductor substrate 10 where shallow trench isolations (STI) are planned. The STI will serve as boundaries for the active device areas. A trench filling oxide (not shown) is deposited to fill the trenches. The silicon nitride layer 18 and pad oxide layer 14 are etched away and the trench filling oxide is planarized to complete the STI regions.

Figure 2:
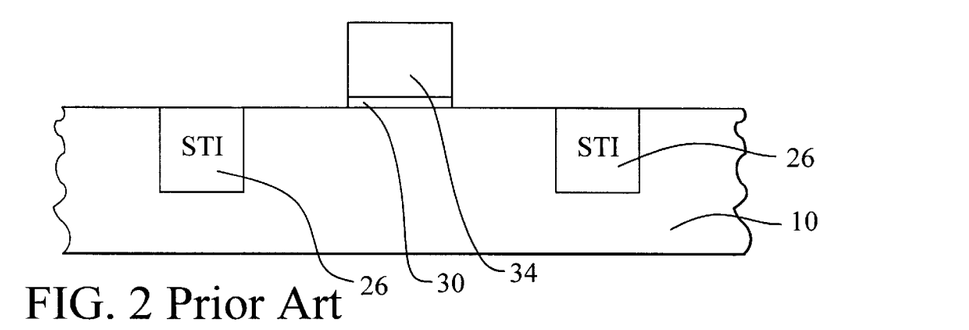

Referring now to FIG. 2, the next step in the prior art processing sequence is illustrated. Note first the completed STI structures 26. A gate oxide layer 30 is formed overlying the semiconductor substrate 10. A polysilicon layer 34 is deposited overlying the gate oxide layer 30. The polysilicon layer 34 and the gate oxide layer 30 are then patterned using a masking process to form the gate electrode of the planned MOS transistor.

Figure 3:
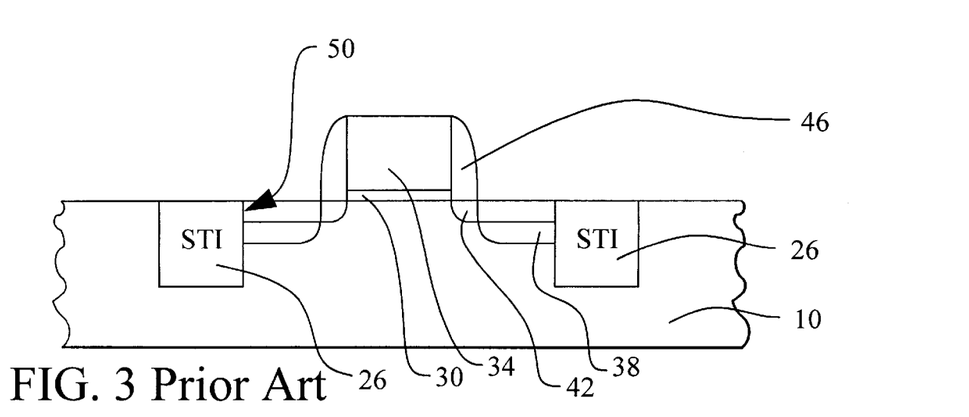

Referring now to FIG. 3, the device is shown after further processing. Lightly doped drain (LDD) regions 42 and heavily doped drains and sources 38 are implanted into the semiconductor substrate 10. Sidewall spacers 46 are formed adjacent to the gate electrode 34. Two observations may be made concerning the typical device shown in FIG. 3. First, the STI regions 26 often exhibit junction leakage problems near the edge 50 of the STI for a variety of well-known reasons including problems with etching defects and substrate stress as well as problems with the planarization process (polishing). Second, the fact that the polysilicon layer 34 is deposited overlying only the very thin gate oxide layer 30 means that all of the polysilicon layer 34 overlying the active area of the substrate (between the STI structures 26) is effectively a gate electrode. This means that any use of the polysilicon layer 34 as a local interconnect must be done outside of the active area.

Figure 4:
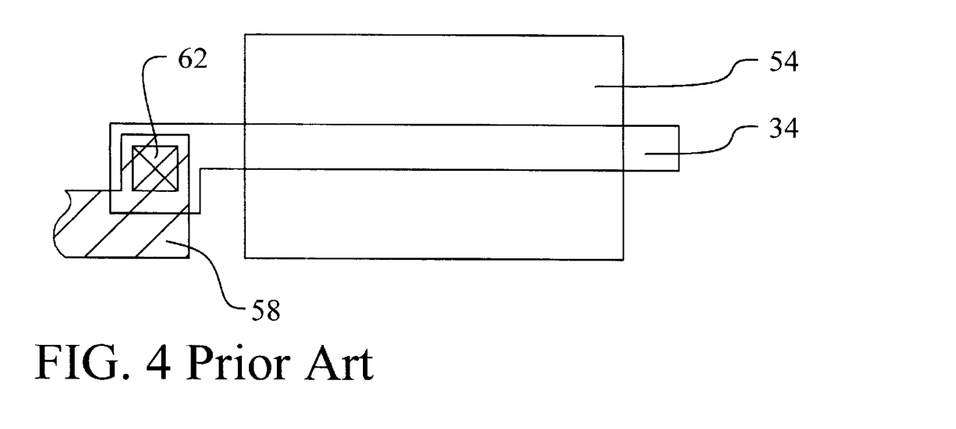
FIG. 4 schematically illustrates a top view of the partially completed prior art integrated circuit.

Referring now to FIG. 4, the impact of the second observation is made clearer. A top view of the prior art device is shown. The polysilicon layer 34 is shown intersecting a rectangle 54 which represents the active area inside of the STI regions. The intersection between the polysilicon layer 34 and the active area 54 is the gate electrode of the transistor. A metal interconnecting layer 58 is shown connecting to the polysilicon layer 34 through a contact opening 62. Note that the processing sequence and approach of the prior art requires that the contact 62 between the polysilicon layer 34 and the metal interconnect layer 58 be made outside of the active area 54. This layout rule uses precious space in the integrated circuit.

Several prior art approaches disclose methods to form transistors and shallow trench isolations in the manufacture of an integrated circuit device. U.S. Pat. No. 5,856,225 to Lee et al discloses a method to form a MOSFET with a self-aligning channel. A temporary or dummy gate is formed from a stack of pad oxide, polysilicon, and a capping insulator. After formation of source and drain junctions, the dummy gate is removed. The threshold voltage and the anti-punchthrough implants are then performed. After gate oxide formation, a new polysilicon layer is deposited and polished down to form the permanent gate. Notably, since the polysilicon gate is here defined by polishing down, connections to the metal layer must be made outside the active area. Connectivity between metal and polysilicon over the gate region must be avoided due to metal migration, spiking, and reliability concerns. U.S. Pat. No. 5,786,255 to Yeh et al teaches a method to form a MOSFET with STI structures. A thick silicon nitride layer is deposited overlying the semiconductor substrate. Openings are etched through the silicon nitride layer where transistors are planned. After formation of gate oxide and silicide, the nitride is removed. Drains and sources are then implanted. U.S. Pat. No. 5,915,183 to Gambino et al discloses a method to form silicided drains and sources. A thick silicon nitride layer is deposited over the semiconductor substrate. Openings are etched through the silicon nitride layer for planned transistor gates. Polysilicon is deposited and planarized. The silicon nitride layer is etched to form sidewall spacers on the polysilicon gate and the STI. Raised polysilicon source and drain regions are formed. The drain and source junctions are then formed in the second polysilicon layer. U.S. Pat. No. 5,915,181 to Tseng discloses a process to form deep sub-micron MOSFETS. An opening is etched into an insulator layer for planned transistor gates. The gate electrode is formed in the opening. The insulator layer is then removed to thereby complete the gate electrode of the MOSFET device. U.S. Pat. No. 5,686,321 to Ko et al teaches a process to form a transistor where an opening is formed in the silicon nitride where the gate electrode is planned. After threshold implant, the opening is filled with polysilicon. The silicon nitride layer is then removed, and the polysilicon gate remains.

SUMMARY OF THE INVENTION

A principal object of the present invention is to provide an effective and very manufacturable method of forming MOS transistors in the manufacture of integrated circuits.

Another further object of the present invention is to provide a method to form both the MOSFET transistor electrodes and local interconnects from the same layer.

A yet further object of the present invention is to allow the local interconnect layer to be contacted within the active device area.

Another object of the present invention is to use a single silicon nitride layer for defining the shallow trench isolation trenches and for defining the gate electrode dimensions.

Another object of the present invention is to improve the characteristics of the shallow trench isolations.

In accordance with the objects of this invention, a new method of forming MOS transistors in the manufacture of an integrated circuit device has been achieved. A semiconductor substrate is provided. A pad oxide layer is grown overlying the semiconductor substrate. A silicon nitride layer is deposited overlying the pad oxide layer. The silicon nitride layer, pad oxide layer, and the semiconductor substrate are patterned to form trenches for planned shallow trench isolations. A trench liner oxide layer is grown on the exposed semiconductor substrate inside of the trenches. A trench oxide layer is deposited overlying the silicon nitride layer and filling the trenches. The trench oxide layer is polished down to the silicon nitride layer to complete the shallow trench isolations. The silicon nitride layer is patterned to form dummy gates where the transistor gates are planned. An oxide liner layer is deposited overlying the dummy gates, the shallow trench isolations, and the semiconductor substrate. Ions are implanted into the semiconductor substrate to form lightly doped drain junctions. Sidewall spacers are formed adjacent to the dummy gate electrodes and the shallow trench isolations. Ions are implanted into the semiconductor substrate to form the drain and source junctions. A silicon layer is selectively grown overlying the source and drain junctions. The silicon layer is converted into silicide to thereby form silicided source and drain contacts. An interlevel dielectric layer is deposited overlying the dummy gates, the shallow trench isolations, and the silicided source and drain contacts. The interlevel dielectric is polished down to the dummy gates. The dummy gates are etched away to form openings for the replacement transistor gates. A gate oxide layer is deposited lining the transistor gate openings. A gate electrode layer is deposited overlying the gate oxide layer to fill the transistor gate openings. The gate electrode layer is patterned to complete the transistor gates, to complete the local interconnects for the transistors, and the integrated circuit device is completed.

BRIEF DESCRIPTION OF THE DRAWINGS

In the accompanying drawings forming a material part of this description, there is shown.

DESCRIPTION OF THE PREFERRED EMBODIMENTS

The embodiment discloses the application of the present invention to the formation of MOS transistors in the manufacture of an integrated circuit device. It should be clear to those experienced in the art that the present invention can be applied and extended without deviating from the scope of the present invention.

Figure 5:
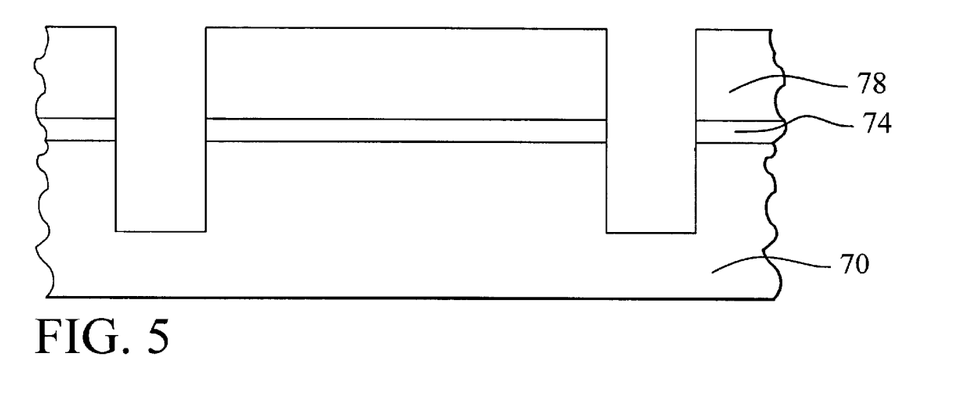
FIGS. 5 through 13 schematically illustrate in cross-section the preferred embodiment of the present invention.

Referring now particularly to FIG. 5, there is shown a cross section of a partially completed integrated circuit device of the preferred embodiment. A semiconductor substrate 70, typically consisting of monocrystalline silicon, is provided. A pad oxide layer 74 is grown overlying the semiconductor substrate 70 as shown. The pad oxide layer 74 relieves surface stress and provides better adhesion for the subsequently deposited silicon nitride layer. The pad oxide layer is grown by a conventional thermal oxidation process to a thickness of between about 80 Angstroms and 150 Angstroms. A silicon nitride layer 78 is deposited overlying the pad oxide layer 74. The silicon nitride layer 78 will be used to create dummy gates and as a polishing stop. The silicon nitride layer 78 is deposited using a conventional chemical vapor deposition (CVD) process to a thickness of between about 2,000 Angstroms and 3,000 Angstroms. The combined thickness of the silicon nitride layer 78 and the pad oxide layer 74 is important because it determines the thickness of the final transistor gate electrode.

Figure 6:
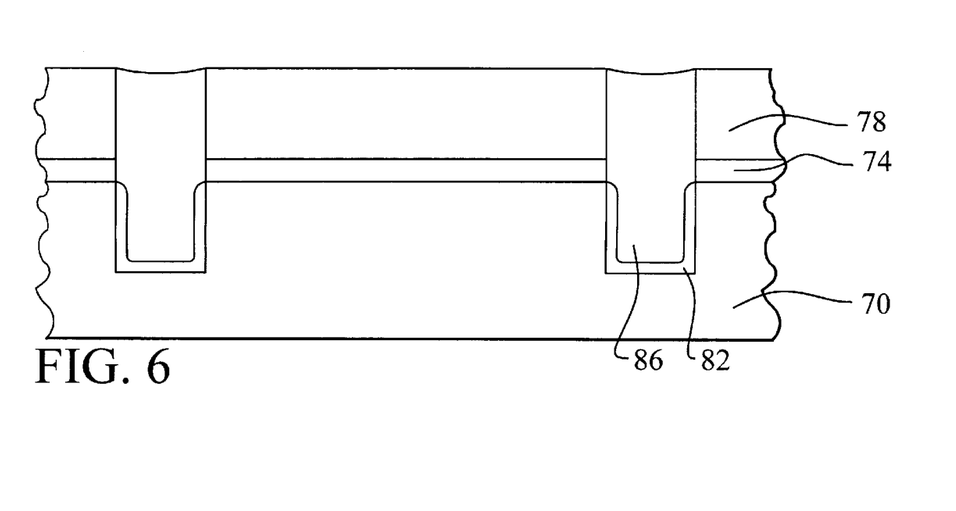

Referring now to FIG. 6, an important feature of the present invention is illustrated. The silicon nitride layer 78, the pad oxide layer 74, and the semiconductor substrate 70 are patterned to form trenches for planned shallow trench isolations. The patterning is conventionally performed using a photolithographic sequence of coating with photoresist, exposing through a mask, developing, and etching. The trenches for the planned shallow trench isolations are etched to a depth of between about 2,500 Angstroms and 3,500 Angstroms. The semiconductor substrate 70 between the isolation trenches is the active area for the planned transistor shown.

Following trench formation, a trench liner oxide layer 82 is grown on the exposed semiconductor substrate 70 inside of the trenches. The presence of the trench liner oxide layer 82, especially on the sidewalls, reduces the parasitic junction leakage for devices formed adjacent to the STI. This step is optional to the present invention process. The oxidation step is performed by a thermal oxidation. The oxide layer 82 is grown to a thickness of between about 150 Angstroms and 300 Angstroms.

Next, a trench oxide layer 86 is deposited overlying the silicon nitride layer 78 and filling the trenches. The trench oxide layer 86 serves as the isolation dielectric for the shallow trenches. The trench oxide layer 86 is deposited using low pressure chemical vapor deposition (LPCVD) to a thickness of between about 6,000 Angstroms and 8,000 Angstroms. The trench oxide layer 86 is then polished down to silicon nitride layer 78. This polishing down step removes excess trench oxide layer 86 so that the remaining oxide is confined to the trenches. The silicon nitride layer 78 serves as a polishing stop for the conventional chemical mechanical polish (CMP).

Figure 7:
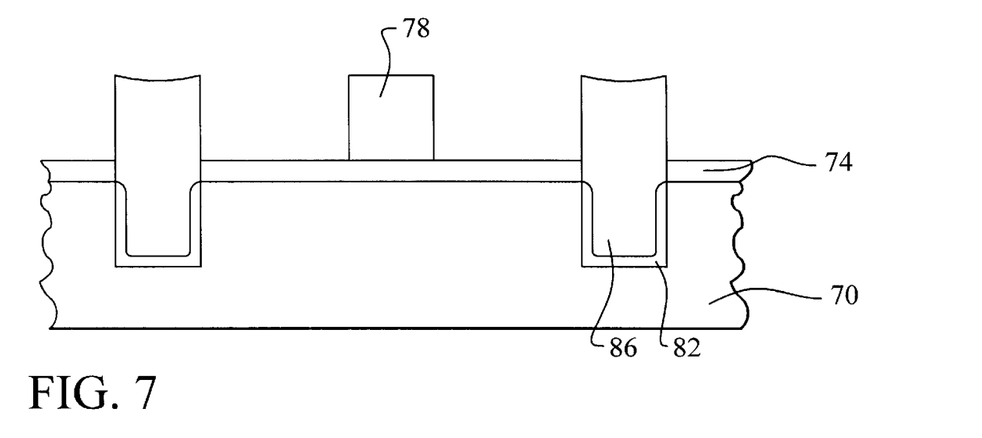

Referring now to FIG. 7, another important feature of the present invention is shown. The silicon nitride layer 78 is patterned to form dummy gates 78 where the transistor gates are planned. Note that the same silicon nitride layer 78 used in the previous step to define the active area and STI structures, is used in the present step to define the dummy gate for the planned transistor. The patterning is conventionally performed using a photolithographic sequence of coating with photoresist, exposing through a mask, developing, and etching.

Figure 8:
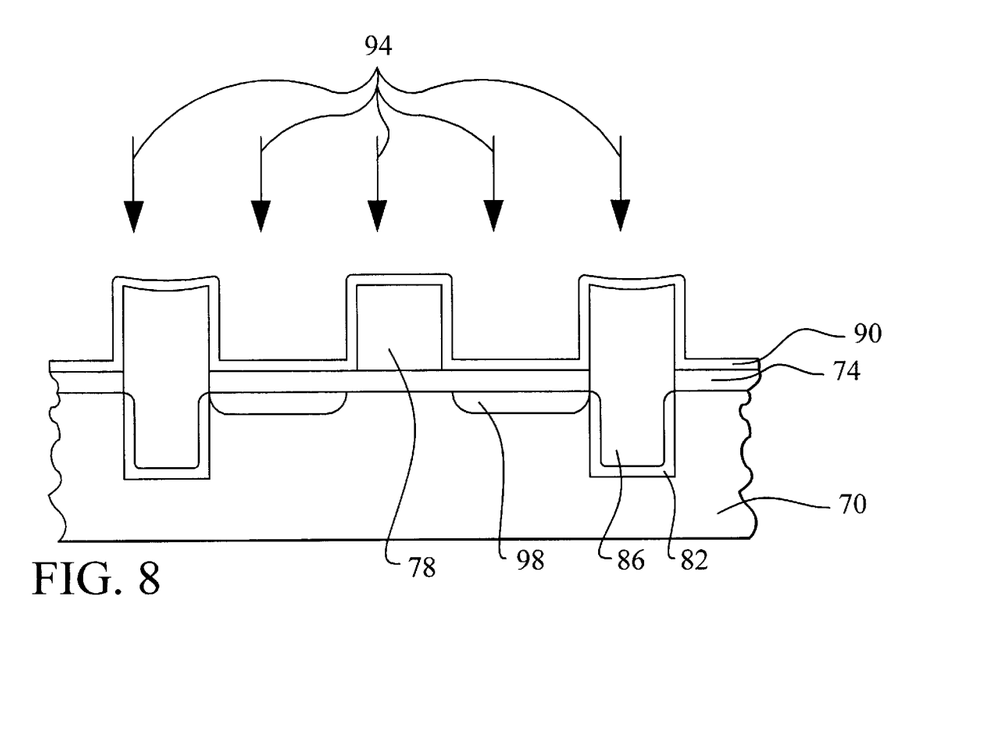

Referring now to FIG. 8, another important part of the present invention is shown. An oxide liner layer 90 is deposited overlying the dummy gates 78, the shallow trench isolations 86, and the semiconductor substrate 70. The oxide liner layer 90 serves to protect the silicon nitride dummy gate 78 during the subsequent plasma etching used to form sidewall spacers. The oxide liner layer 90 is deposited by LPCVD to a thickness of between about 300 Angstroms and 600 Angstroms.

Ions are then implanted 94 into the semiconductor substrate 70 to form lightly doped drain regions 98 for the planned transistors. The dose and energy of the implant is such that implantation is self-aligned to the dummy gate electrode 78 and the STI structures 86. The ionic species is selected to form either p-type or n-type junctions, depending upon the transistor type. The lightly doped drain regions 98 have a junction depth of between about 800 Angstroms and 1,500 Angstroms and a dopant concentration of between about $1\times10^{19}$ atoms/cm$^3$ and $1\times10^{20}$ atoms/cm$^3$.

Figure 9:
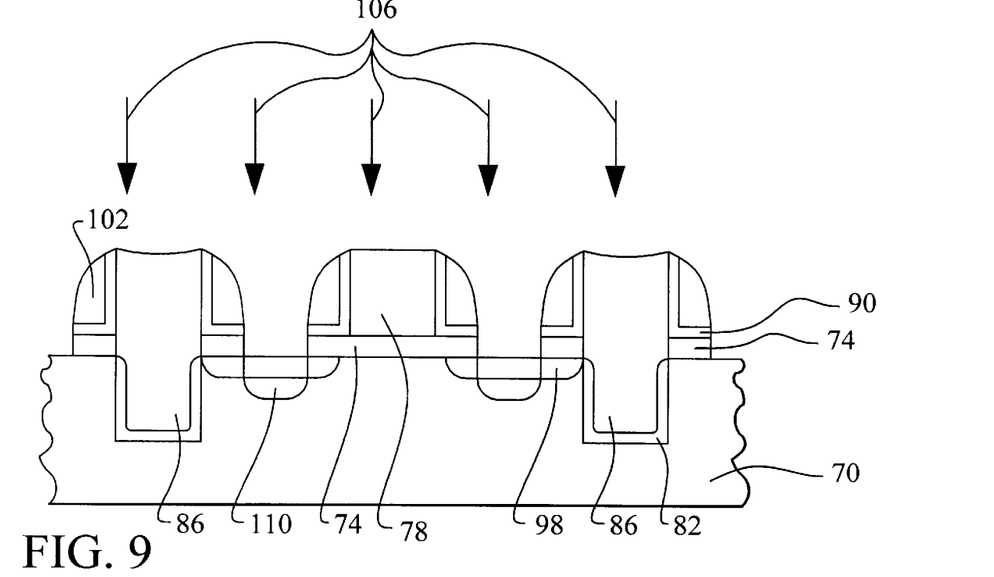

Referring now to FIG. 9, an important feature of the present invention is shown. Sidewall spacers 102 are formed adjacent to the dummy gates 78 and the shallow trench isolations 86. The sidewall spacers 102 comprise silicon dioxide that is deposited using a conventional high density plasma "sputter-deposit" process. As additional silicon dioxide is deposited in the plasma process, anisotropic vertical etching removes a part of the deposited oxide as well as the oxide liner layer 90 and the pad oxide layer 74.

The resulting sidewall spacers 102 provide two functions. First, the conventional spacing on the sides of the dummy gates 78 allows the subsequently implanted heavily doped source and drain junctions to be offset from the MOSFET channel. This improves short-channel performance as typical in the art. In addition, the presence of the sidewall spacers 102 adjacent to the STI structures 86 improves the isolation performance of the STI. Parasitic junction leakage is reduced by the additional spacing of the heavily doped junction.

Ions are then implanted 106 into the semiconductor substrate 70 to form source and drain junctions 110 for the transistor. The ionic species is selected to create either p-type or n-type junctions depending on the transistor type. The junctions 110 are self-aligned to the sidewall spacers 102 and the STI regions 86. The drain and source junctions 110 have a junction depth of between about 1,000 Angstroms and 2,000 Angstroms and a dopant concentration of between about $1\times10^{20}$ atoms/cm$^3$ and $5\times10^{20}$ atoms/cm$^3$.

Figure 10:
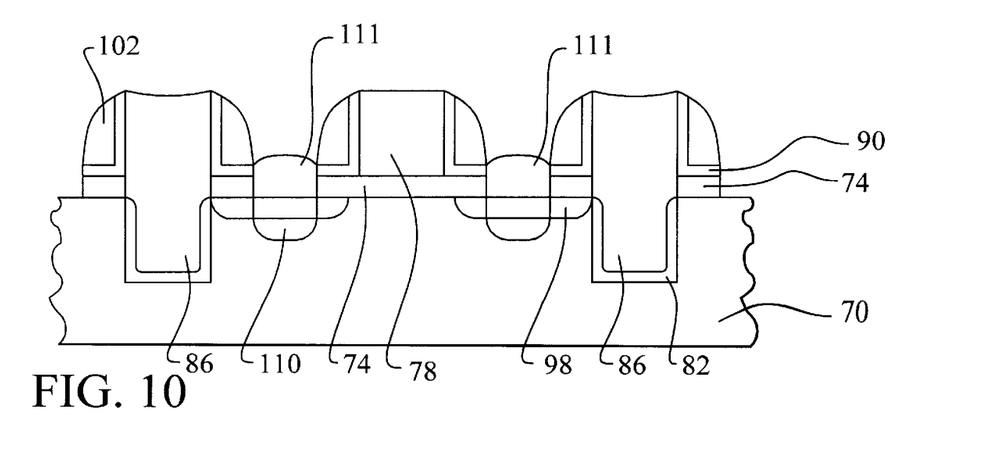

Referring now to FIG. 10, an epitaxial silicon layer 111 is selectively grown overlying the source and drain junctions 110. The epitaxial silicon layer 111 will subsequently be converted to a silicide layer. The way of growing a silicon layer is well known as selective epitaxial growth (SEG) of silicon. The epitaxial silicon layer 111 is grown by SEG to a thickness of between about 500 Angstroms and 1,000 Angstroms.

Figure 11:
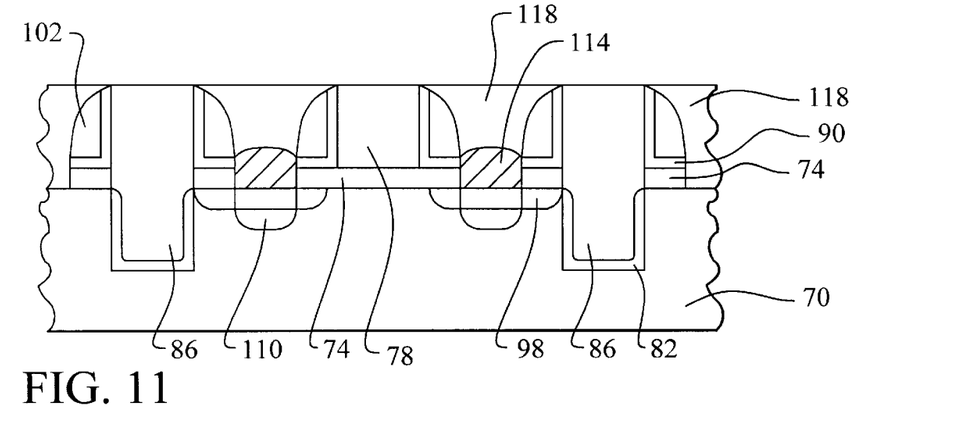

Referring now to FIG. 11, two important features of the present invention are illustrated. First, the epitaxial silicon layer is converted into a silicided layer 114. A metal layer (not shown) is first deposited overlying the epitaxial silicon layer 111 as a first step in forming a metal silicide layer. A first rapid thermal anneal (RTA) is then performed to anneal the metal layer and the epitaxial silicon layer 111 to thereby form a silicided layer 114. The first RTA is performed at a temperature of between about 600 degrees C. and 750 degrees C. for about 30 seconds. The unreacted metal layer is then removed. A second RTA is then performed to reduce the resistivity of the silicided layer 114. The second RTA is performed at between about 800 degrees C. and 900 degrees C. for about 30 seconds.

Note that no silicide is formed on the dummy gate 78 since the silicon nitride of the dummy gate 78 does not react with the metal layer. The process is therefore a self-aligned silicide (salicide) that does not form silicide on the gate. Note also that the epitaxial silicon layer 111 is consumed in the silicide process. The underlying source and drain junctions 98 and 110 are therefore not consumed in the silicidation process. The silicided source and drain contacts 114 have decreased resistivity compared to non-silicided source and drain contacts while reducing the possibility of metal junction spiking.

Second, an interlevel dielectric layer 118 is deposited overlying the dummy gates 78, and the silicided source and drain contacts 114. The interlevel dielectric layer 118 comprises a silicon dioxide material that is preferably deposited using a high density plasma (HDP) process. The use of an HDP process insures the formation of a high quality oxide and complete filling of any gaps and trenches. The interlevel dielectric layer 118 is deposited to a thickness of between about 5,000 Angstroms and 8,000 Angstroms. The interlevel dielectric layer 118 is then polished down to the dummy gates. The polishing down is preferably performed using a chemical mechanical polish (CMP). The interlevel dielectric layer 118 levels the surface of the integrated circuit device.

Figure 12:
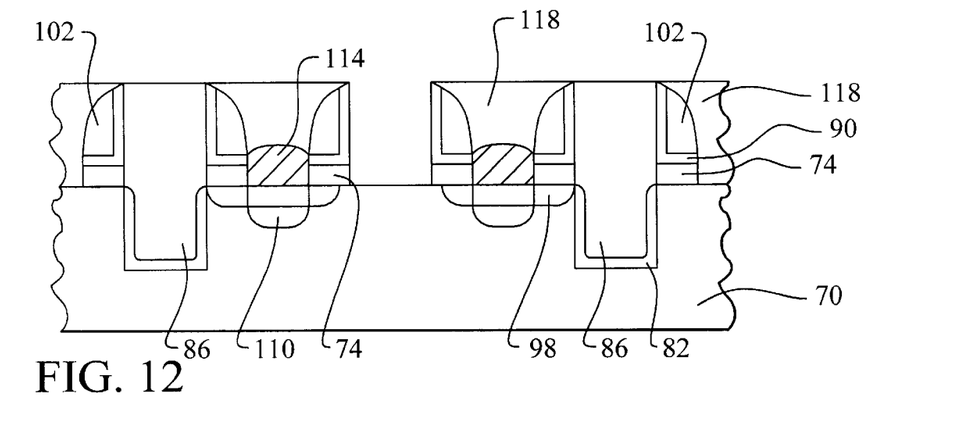

Referring now to FIG. 12, the dummy gates are etched away to form openings for the planned transistor gates.

This step creates openings where the permanent gates will be formed. The silicon nitride material of the dummy gates may be etched using, for example, hot phosphoric acid.

Figure 13:
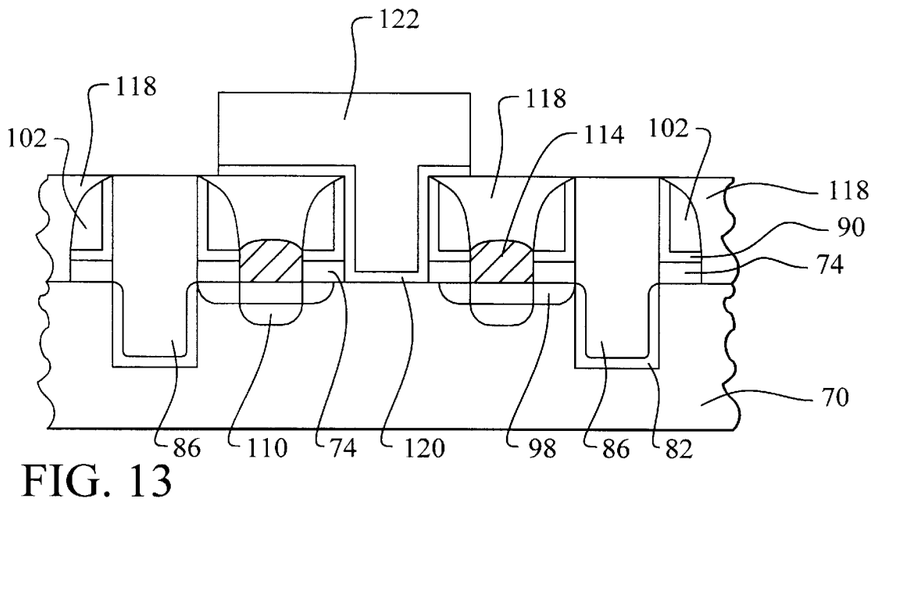

Referring now to FIG. 13, important features of the present invention are illustrated. A gate oxide layer 120 is deposited lining the transistor gate openings. The gate oxide layer 120 is deposited via a conventional CVD process. The gate oxide layer 120 is deposited to a thickness of between about 20 Angstroms and 80 Angstroms. The gate oxide layer 120 will serve as the dielectric for the final transistor gates.

A gate electrode layer 122 is deposited overlying the gate oxide layer 120 and filling the openings for the gates. The gate electrode layer 122 comprises a conductive material such as aluminum, tungsten, or tungsten silicide.

The gate electrode layer 122 is deposited to a thickness of between about 2,000 Angstroms and 3,000 Angstroms.

The gate electrode layer 122 and the gate oxide layer 120 are patterned to complete the transistor gates and to complete the local interconnects for the transistors. The integrated circuit device is completed. The patterning is conventionally performed using a photolithographic sequence of coating with photoresist, exposing through a mask, developing, and etching.

Figure 14:
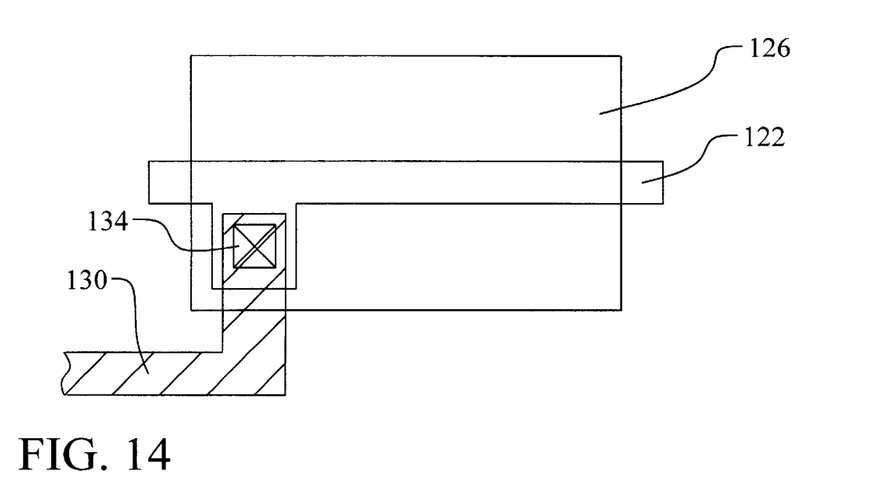
FIG. 14 schematically illustrates a top view of the preferred embodiment of the present invention.

Referring now to FIG. 14, a top view of the completed device shows the advantage of the present invention in reducing the area required for connectivity. The gate electrode layer 122 overlies the active area 126 of the device. The active area 126 is the area between the STI structures. As in the prior art, the intersection of the gate electrode layer 122 and the active area 126 forms the gate of the MOSFET. A metal interconnect layer 130 is shown connecting the gate of the transistor to outside devices. The connection between metal interconnect layer 130 and the gate electrode layer 122 is through the contact 134. Note that the contact 134 between the metal interconnect layer 130 and the gate electrode layer 122 can be made within the active area 126 of the device. This capability allows the layout rules of the integrated circuit to be made tighter and the circuit to be made smaller.

This is possible because the final gate and polysilicon patterning is done after the dielectric layer is laid down. An extra masking step is thus needed to achieve this. Conventionally, the polysilicon interconnect routing is patterned together with the gate. Therefore, the landing pad for contact to gate has to be outside of the active area (as shown in FIG. 4).

As shown in the preferred embodiments, the present invention provides a very manufacturable process for forming MOS transistors in an integrated circuit device. The application of the present invention in the preferred embodiments forms the transistor using a dummy gate process where a single silicon nitride layer is used to form both the dummy gates and the trenches for the shallow trench isolations. The performance of the STI structures is improved. The method reduces layout area for the integrated circuit device by allowing connectivity to the transistor gate within the active area.

While the invention has been particularly shown and described with reference to the preferred embodiments thereof, it will be understood by those skilled in the art that various changes in form and details may be made without departing from the spirit and scope of the invention.

What is claimed is:

1. A method to form transistor gates in the manufacture of an integrated circuit device comprising:

depositing a silicon nitride layer overlying a semiconductor substrate;

patterning said silicon nitride layer and said semiconductor substrate to form trenches for planned shallow trench isolations;

depositing a trench oxide layer overlying said silicon nitride layer and filling said trenches;

polishing down said trench oxide layer to said silicon nitride layer to complete said shallow trench isolations;

thereafter patterning said silicon nitride layer to form dummy gates where said transistor gates are planned;

depositing an oxide liner layer overlying said dummy gates, said shallow trench isolations, and said semiconductor substrate;

implanting ions into said semiconductor substrate to form lightly doped drain junctions;

forming sidewall spacers adjacent to said dummy gates and said shallow trench isolations;

thereafter implanting ions into said semiconductor substrate to form source and drain junctions;

thereafter depositing an interlevel dielectric layer overlying said dummy gates, said shallow trench isolations, and said semiconductor substrate;

polishing down said interlevel dielectric layer to said dummy gates;

etching away said dummy gates to form openings for planned transistor gates;

depositing a gate oxide layer lining said openings for planned transistor gates;

depositing a gate electrode layer overlying said gate oxide layer and filling said openings for planned transistor gates; and patterning said gate electrode layer to complete said transistor gates and to complete the local interconnects for said transistors in the manufacture of the integrated circuit device.

2. The method according to claim 1 wherein said silicon nitride layer is deposited to a thickness of between about 2,000 Angstroms and 3,000 Angstroms.

3. The method according to claim 1 wherein said oxide liner layer is deposited to a thickness of between about 150 Angstroms and 300 Angstroms.

4. The method according to claim 1 wherein said gate oxide layer is deposited to a thickness of between about 20 Angstroms and 80 Angstroms.

5. The method according to claim 1 wherein said gate electrode layer comprises one conductive material of the group containing: aluminum, tungsten, and tungsten silicide.

6. The method according to claim 1 further comprising growing a pad oxide layer overlying said semiconductor layer before said step of depositing a silicon nitride layer.

7. The method according to claim 1 further comprising growing a trench liner oxide layer overlying said semiconductor substrate inside of said trenches after said step of patterning said trenches and before said step of depositing said trench oxide layer.

8. The method according to claim 1 further comprising:

selectively growing an epitaxial silicon layer overlying said source and drain junctions after said step of implanting ions to form said source and drain junctions;

depositing a metal layer overlying said epitaxial silicon layer;

annealing said metal layer and said epitaxial silicon layer to convert said epitaxial silicon layer into salicide and to thereby form silicided source and drain contacts; and removing remaining said metal layer before said step of depositing said interlevel dielectric layer.

9. The method according to claim 8 wherein said metal layer comprises titanium.

10. A method to form transistor gates in the manufacture of an integrated circuit device comprising:

growing a pad oxide layer overlying a semiconductor substrate;

depositing a silicon nitride layer overlying said pad oxide layer;

patterning said silicon nitride layer, said pad oxide layer, and said semiconductor substrate to form trenches for planned shallow trench isolations;

depositing a trench oxide layer overlying said silicon nitride layer and filling said trenches;

polishing down said trench oxide layer to the top surface of said silicon nitride layer to complete said shallow trench isolations;

thereafter patterning said silicon nitride layer to form dummy gates where said transistor gates are planned;

depositing an oxide liner layer overlying said dummy gates, said shallow trench isolations, and said semiconductor substrate;

implanting ions into said semiconductor substrate to form lightly doped drain junctions;

forming sidewall spacers adjacent to said dummy gates and said shallow trench isolations;

thereafter implanting ions into said semiconductor substrate to form source and drain junctions;

thereafter depositing an interlevel dielectric layer overlying said dummy gates, said shallow trench Isolations, and said semiconductor substrate;

polishing down said interlevel dielectric layer to said dummy gates;

etching away said dummy gates to form openings for planned transistor gates;

depositing a gate oxide layer lining said openings for planned transistor gates;

depositing a gate electrode layer overlying said gate oxide layer and filling said openings for planned transistor gates; and patterning said gate electrode layer to complete said transistor gates and to complete the local interconnects for said transistors in the manufacture of the integrated circuit device.

11. The method according to claim 10 wherein said silicon nitride layer is deposited to a thickness of between about 2,000 Angstroms and 3,000 Angstroms.

12. The method according to claim 10 wherein said gate oxide layer is deposited to a thickness of between about 20 Angstroms and 80 Angstroms.

13. The method according to claim 10 wherein said gate electrode layer comprises one conductive material of the group containing: aluminum, tungsten, and tungsten silicide.

14. The method according to claim 10 further comprising growing a trench liner oxide layer overlying said semiconductor substrate inside of said trenches after said step of patterning said trenches and before said step of depositing said trench oxide layer.

15. The method according to claim 10 further comprising:
selectively growing an epitaxial silicon layer overlying said source and drain junctions after said step of implanting ions to form said source and drain junctions;
depositing a metal layer overlying said epitaxial silicon layer;
annealing said metal layer and said epitaxial silicon layer to convert said epitaxial silicon layer into salicide and to thereby form silicided source and drain contacts; and
removing remaining said metal layer before said step of depositing said interlevel dielectric layer.

16. The method according to claim 15 wherein said metal layer comprises titanium.

17. A method to form transistor gates in the manufacture of an integrated circuit device comprising:
providing a semiconductor substrate;
growing a pad oxide layer overlying said semiconductor substrate;
depositing a silicon nitride layer overlying said pad oxide layer;
patterning said silicon nitride layer, said pad oxide layer, and said semiconductor substrate to form trenches for planned shallow trench isolations;
growing a trench liner oxide layer overlying said semiconductor substrate inside of said trenches;
depositing a trench oxide layer overlying said silicon nitride layer and filling said trenches;
polishing down said trench oxide layer to said silicon nitride layer to complete said shallow trench isolations;
thereafter patterning said silicon nitride layer to form dummy gates where transistor gates are planned;
depositing an oxide liner layer overlying said dummy gates, said shallow trench isolations, and said semiconductor substrate;
implanting ions into said semiconductor substrate to form lightly doped drain junctions;
forming sidewall spacers adjacent to said dummy gates and said shallow trench isolations;
thereafter implanting ions into said semiconductor substrate to form source and drain junctions;
selectively growing an epitaxial silicon layer overlying said source and drain junctions;
depositing a metal layer overlying said epitaxial silicon layer;
annealing said metal layer and said epitaxial silicon layer to convert said epitaxial silicon layer into salicide and to thereby form silicided source and drain contacts;
removing remaining said metal layer;
depositing an interlevel dielectric layer overlying said dummy gates, said shallow trench isolations, and said silicided source and drain contacts;
polishing down said interlevel dielectric layer to said dummy gates;
etching away said dummy gates to form openings for said planned transistor gates;
depositing a gate oxide layer lining said openings for said planned transistor gates;
depositing a gate electrode layer overlying said gate oxide layer and filling said openings for said planned transistor gates; and
patterning said gate electrode layer to complete said transistor gates and to completed the local interconnects for said transistors in the manufacture of the integrated circuit device.

18. The method according to claim 17 wherein said silicon nitride layer is deposited to a thickness of between about 2,000 Angstroms and 3,000 Angstroms.

19. The method according to claim 17 wherein said gate electrode layer comprises one conductive material of the group containing: aluminum, tungsten, and tungsten silicide.

20. The method according to claim 17 wherein said metal layer comprises titanium.

* * * * *